United States Patent
Li et al.

(10) Patent No.: US 10,748,759 B2
(45) Date of Patent: Aug. 18, 2020

(54) METHODS FOR IMPROVED SILICON NITRIDE PASSIVATION FILMS

(71) Applicant: Applied Materials, Inc., Santa Clara, CA (US)

(72) Inventors: Jianheng Li, Santa Clara, CA (US); Lai Zhao, Campbell, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/248,265

(22) Filed: Jan. 15, 2019

(65) Prior Publication Data

US 2020/0227249 A1 Jul. 16, 2020

(51) Int. Cl.
*H01L 21/02* (2006.01)
*H01L 29/786* (2006.01)
*H01L 29/66* (2006.01)

(52) U.S. Cl.
CPC .... *H01L 21/0217* (2013.01); *H01L 21/02211* (2013.01); *H01L 21/02274* (2013.01); *H01L 29/66969* (2013.01); *H01L 29/7869* (2013.01)

(58) Field of Classification Search
None
See application file for complete search history.

(56) References Cited

U.S. PATENT DOCUMENTS

| | | | |
|---|---|---|---|
| 7,221,039 B2 | 5/2007 | Huang et al. | |
| 9,287,137 B2 | 3/2016 | Wang et al. | |
| 9,553,195 B2 | 1/2017 | Chen et al. | |
| 9,773,921 B2 | 9/2017 | Nunan et al. | |
| 2007/0096209 A1* | 5/2007 | Toyota | H01L 27/12 257/347 |
| 2008/0054795 A1* | 3/2008 | Ohmi | H01L 51/5206 313/504 |
| 2010/0059745 A1* | 3/2010 | Yoon | H01L 27/1214 257/43 |
| 2010/0243999 A1* | 9/2010 | Ishikawa | C23C 16/345 257/40 |
| 2012/0171391 A1* | 7/2012 | Won | H01J 37/3244 427/575 |
| 2013/0222217 A1* | 8/2013 | Shin | H01L 27/326 345/80 |
| 2013/0280859 A1 | 10/2013 | Kim et al. | |
| 2015/0021599 A1 | 1/2015 | Ridgeway et al. | |
| 2016/0155828 A1* | 6/2016 | Sugawara | H01L 21/02323 438/104 |

* cited by examiner

*Primary Examiner* — Benjamin P Sandvik
(74) *Attorney, Agent, or Firm* — Patterson + Sheridan, LLP

(57) ABSTRACT

The present disclosure relates to an improved large area substrate semiconductor device having a high density passivation layer, and method of fabrication thereof. More specifically, a high density SiN passivation layer is formed by plasma enhanced chemical vapor deposition of silane and nitrogen gases at low temperatures. Argon is added as a diluent gas in order to increase SiN passivation layer film density and overall film quality.

13 Claims, 4 Drawing Sheets

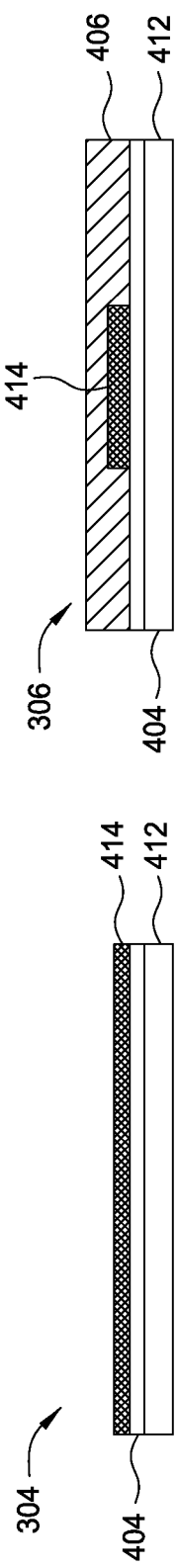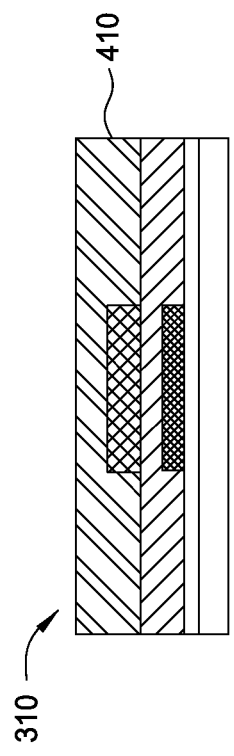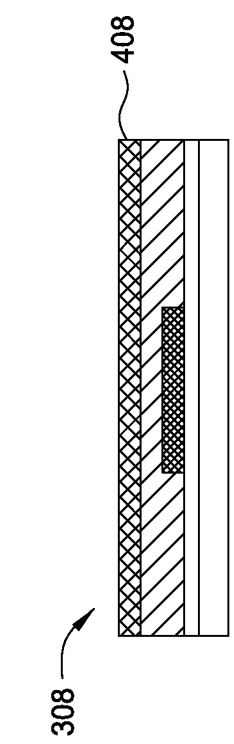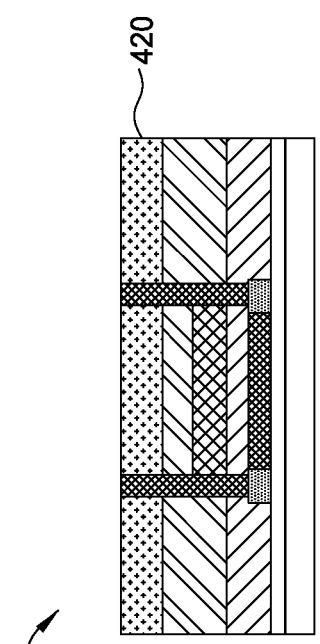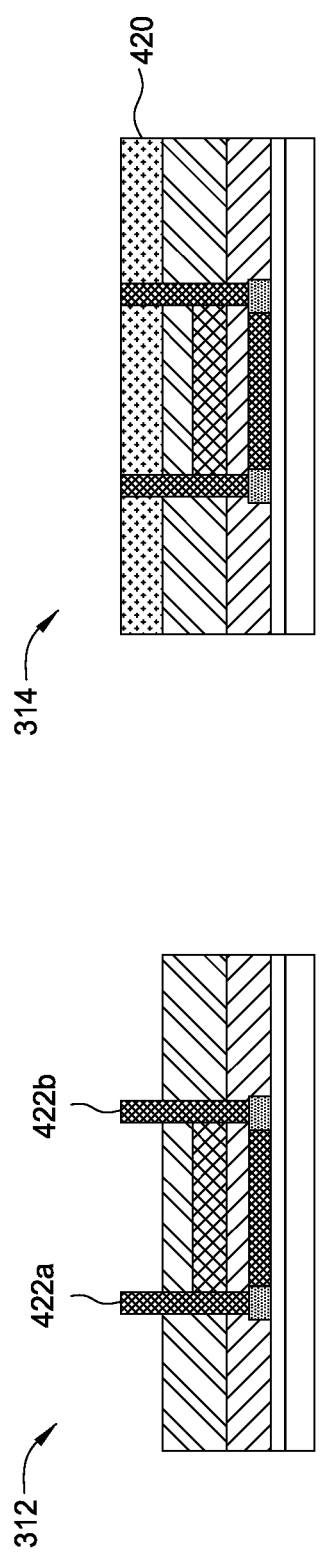

METHODS FOR IMPROVED SILICON NITRIDE PASSIVATION FILMS

BACKGROUND

Field

Embodiments of the present disclosure generally relate to methods for forming a silicon nitride containing layer in semiconductor devices. More particularly, embodiments of the present disclosure generally relate to methods for forming a silicon nitride containing passivation layer that may be used in thin film transistor (TFT) devices.

Description of the Related Art

Display devices have been widely used for a wide range of electronic applications, such as televisions, monitors, mobile phones, MP3 players, e-book readers, personal digital assistants (PDAs) and the like. The display device is generally designed for producing a desired image by applying an electric field to a liquid crystal that fills a gap between two substrates (e.g., a pixel electrode and a common electrode) and has anisotropic dielectric constant that controls the intensity of the dielectric field. By adjusting the amount of light transmitted through the substrates, the light and image intensity, quality and power consumption may be efficiently controlled.

A variety of different display devices, such as organic light emitting diodes (OLED), may be employed as light sources for a display. In the manufacturing of these display devices, an electronic device with high electron mobility, low leakage current, and high breakdown voltage would allow more pixel area for light transmission and integration of circuitry, resulting in a brighter display, higher overall electrical efficiency, faster response time, and higher resolution displays. Low film qualities of the material layers, such as dielectric layers with impurities or low film densities, formed in the device often result in poor device electrical performance and short service life of the devices.

Thus, forming stable and reliable film layers within OLED and TFT devices enables fabrication of a device structure with low film leakage and high breakdown voltage for use in manufacturing electronic devices with lower threshold voltage shift and improved overall performance of the electronic device.

In semiconductor device fabrication, passivation is one method to prevent film layer impurities and enhance semiconductor device quality. Passivation generally includes forming a monolayer or thin control layer on a substrate material surface which leaves the Fermi level unpinned. The formation of SiN passivation layers is generally performed at relatively high temperatures (above about 400° C.) in order to create effective and high density layers. However, these temperatures exceed the thermal budgets of advanced node materials, and thus, the quality and density of SiN passivation layers is sacrificed in order to maintain low processing temperatures and prevent node deformation.

Therefore, there is a need in the art for improved methods of forming a large substrate area TFT device with a high-density SiN passivation layer at low processing temperatures.

SUMMARY

In one embodiment, a method of forming a semiconductor device having a passivation layer is provided. The method includes transferring a substrate into a process chamber, forming a channel layer on the substrate, forming a gate dielectric layer on the substrate, forming one or more metal structures on the substrate, forming an insulating layer on the substrate, forming one or more metal device connections on the substrate, and forming a passivation layer on the substrate. The passivation layer is formed at a temperature of about 100° C. to about 300° C. and in the presence of a gas mixture of silane, nitrogen, and argon, the argon gas supplied at mixing ratio of 1:4 Ar:$N_2$ or higher.

In one embodiment, a method of forming a silicon nitride passivation layer is provided. The method includes transferring a substrate into a process chamber, heating the process chamber to a temperature of about 150° C. to about 300° C., supplying a gas mixture of silane, nitrogen, and argon, and forming a silicon nitride passivation layer.

In one embodiment, an LTPS TFT device is provided. The LTPS TFT device includes a substrate, a channel layer disposed on the substrate, a gate dielectric layer disposed on the substrate, one or more metal structures disposed on the gate dielectric layer, an insulating layer disposed on the one or more metal structures and the gate dielectric layer, one or more metal device connections disposed on the insulating layer, and a passivation layer disposed on the substrate. The passivation layer includes a silicon nitride layer. The silicon nitride layer is formed by heating a process chamber to a temperature of about 150° C. to about 250° C., supplying a gas mixture having silane gas, nitrogen gas, and argon gas to the process chamber. The argon gas is supplied at a mixing ratio of about 1:4 Ar:$N_2$ or higher and the silicon nitride layer is formed on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 4A-4F illustrates a semiconductor device structure having a passivation layer in various stages of fabrication according to one embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to an improved large area substrate semiconductor device having a high density passivation layer, and method of fabrication thereof. More specifically, a high density SiN passivation layer is formed by plasma enhanced chemical vapor deposition of silane and nitrogen gases at low temperatures. Argon is added as a diluent gas in order to increase SiN passivation layer film density and overall quality.

Figure 1:
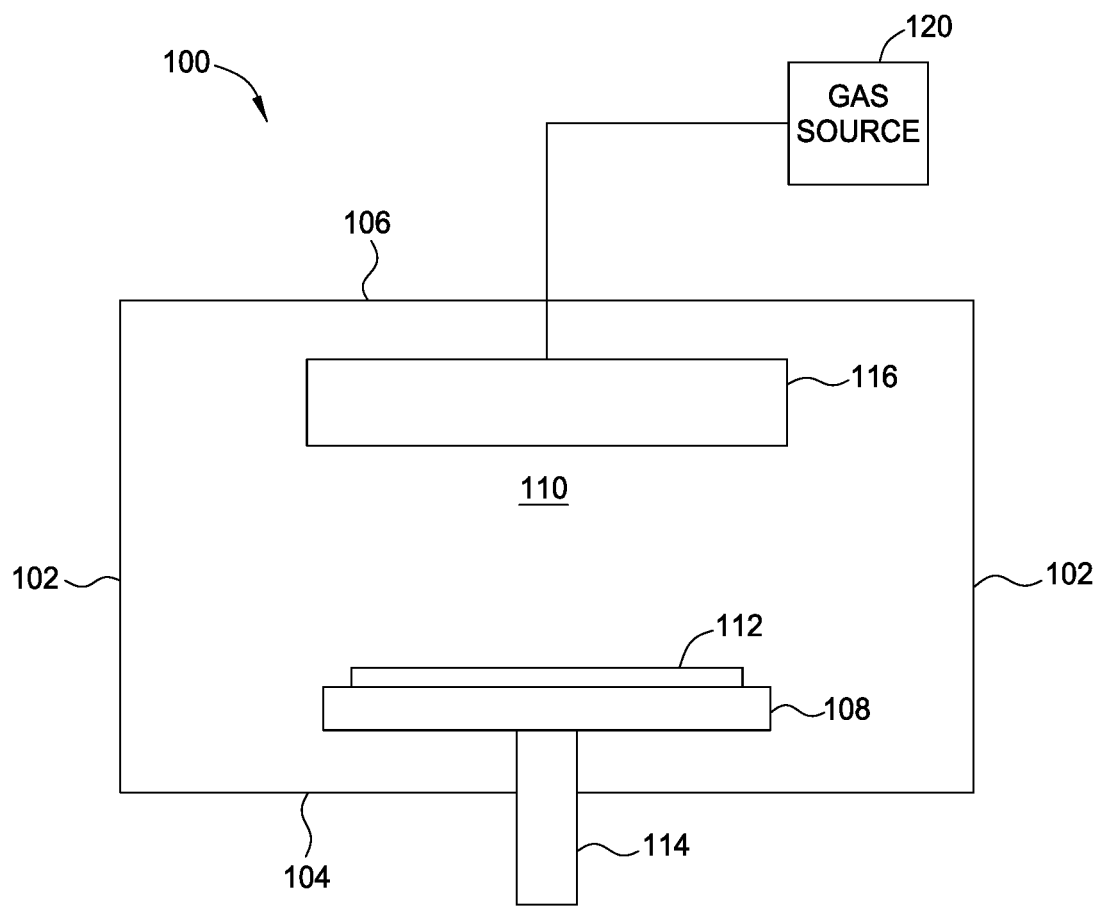
FIG. 1 illustrates a schematic view of a chamber that may be used to fabricate semiconductor devices according to one embodiment described herein.

FIG. 1 illustrates a schematic view of a chamber 100 used to fabricate semiconductor devices according to one embodiment described herein. The chamber 100 includes walls 102, a bottom 104, and a lid 106 which define a process volume 110. The chamber 100 also includes a substrate support 108 and a showerhead 116, which further define the process volume 110. In one embodiment, one or both of the substrate support 108 and/or the showerhead include heating elements, such as resistive heaters, which are suitable for heating the process volume 110 and substrates disposed on the substrate support 108.

A substrate 112 transferred into and out of the process volume 110 before and after processing. During processing, the substrate 112 is positioned on the substrate support 108. A pedestal stem 114 couples the substrate support 108 to a lift system, which raises and lowers the substrate support 108 between substrate transfer and processing positions. A gas source 120 is coupled to the lid 106 to provide gas through the lid 106. The gas source 120 is also coupled to the showerhead 116. The showerhead 116 may be used to change the conductivity type of deposited films, to anneal or harden a device, or to implant the device with a chemical element or compound.

Figure 2:
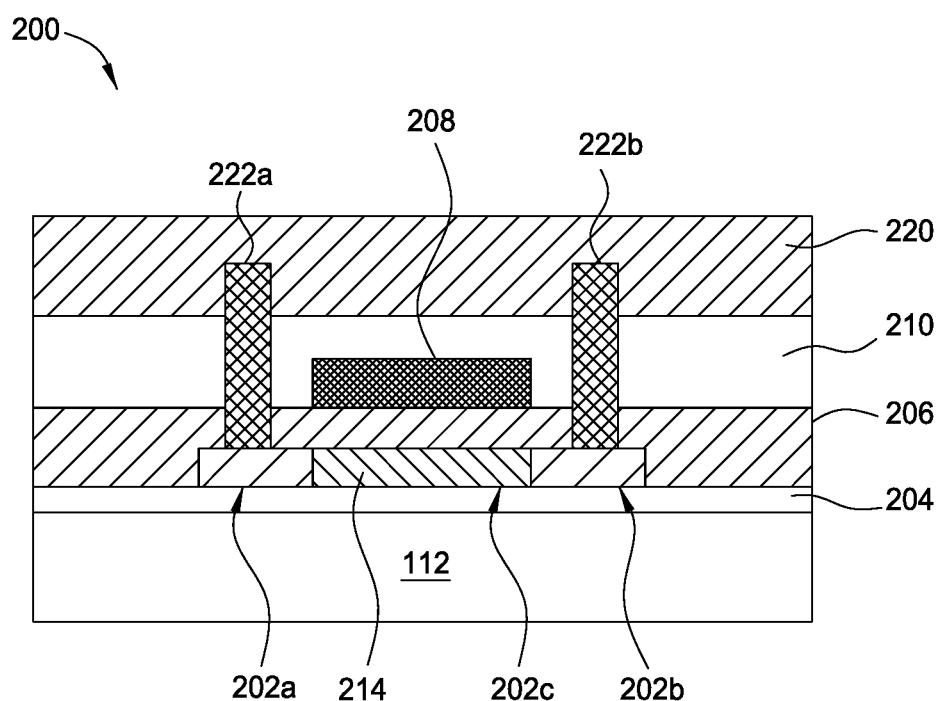
FIG. 2 illustrates a schematic, cross sectional view of an exemplary semiconductor device structure according to one embodiment described herein.

FIG. 2 illustrates a sectional view of an exemplary TFT device 200 structure. In one embodiment, the device 200 is formed on a barrier layer 204 on the substrate 112. In another embodiment, the device 200 is formed directly on the substrate 112. The substrate 112 may be formed of any suitable substrate material, including but not limited to glass, ceramic, metal, plastic or any combination of these materials. The barrier layer 204 may be formed from one or more layers of silicon nitride, silicon oxide, aluminum oxide, gallium nitride, or other suitable inorganic material.

In one embodiment, the device 200 is a metal oxide transistor formed in a top gate configuration. The device 200 includes a channel layer 214 formed directly on the barrier layer 204 in channel region 202c. The channel layer 214 may be any suitable metal oxide channel layer, such as a germanium oxide channel layer. A device connection 222a formed in source region 202a and a device connection 222b formed in drain region 202b contact the channel layer 214 at opposing ends to form a TFT.

The device 200 further includes a gate electrode layer 208 formed on top of a gate dielectric layer 206. The gate electrode layer 208 is formed from a metal material, such as molybdenum, tantalum, or titanium. Other suitable materials that may be used for the gate electrode layer 208 include chromium, copper, tungsten, and any suitable conductive material. The gate electrode layer 208 and the gate dielectric layer 206 are covered by one or more insulating layers 210 of an interlayer dielectric (ILD) material. The one or more insulating layers 210 are formed from materials such as silicon oxide, hafnium oxide, or other suitable dielectric materials. A silicon nitride (SiN) passivation layer 220 is formed on top of the one or more insulating layers 210.

In one embodiment, the device 200 is a low temperature polycrystalline silicon (LTPS) transistor formed using an LTPS process in a top gate configuration. The device 200 may be configured in a similar configuration as described above, but with a polycrystalline silicon channel layer instead of a metal oxide channel layer. The source region 202a, channel region 202c, and drain region 202b may be formed from an initially deposited amorphous silicon layer that is later processed (e.g., annealed) to form a polycrystalline silicon layer. The source, channel, and drain regions 202a, 202c, and 202b, respectively, are formed by patterning areas on the substrate 112 and ion doping the deposited initial amorphous silicon layer, which is then thermally processed to form the polycrystalline silicon layer.

Although depicted in one configuration, the device 200 may also be formed in other configurations. In one example, the device 200 has the gate electrode 208 formed below the channel region 202c, thus making device 200 a bottom gate transistor. In another example, the channel 214 and source regions 202a, 202b are formed directly on the substrate 112 without the intervening barrier level 204.

Figure 3:
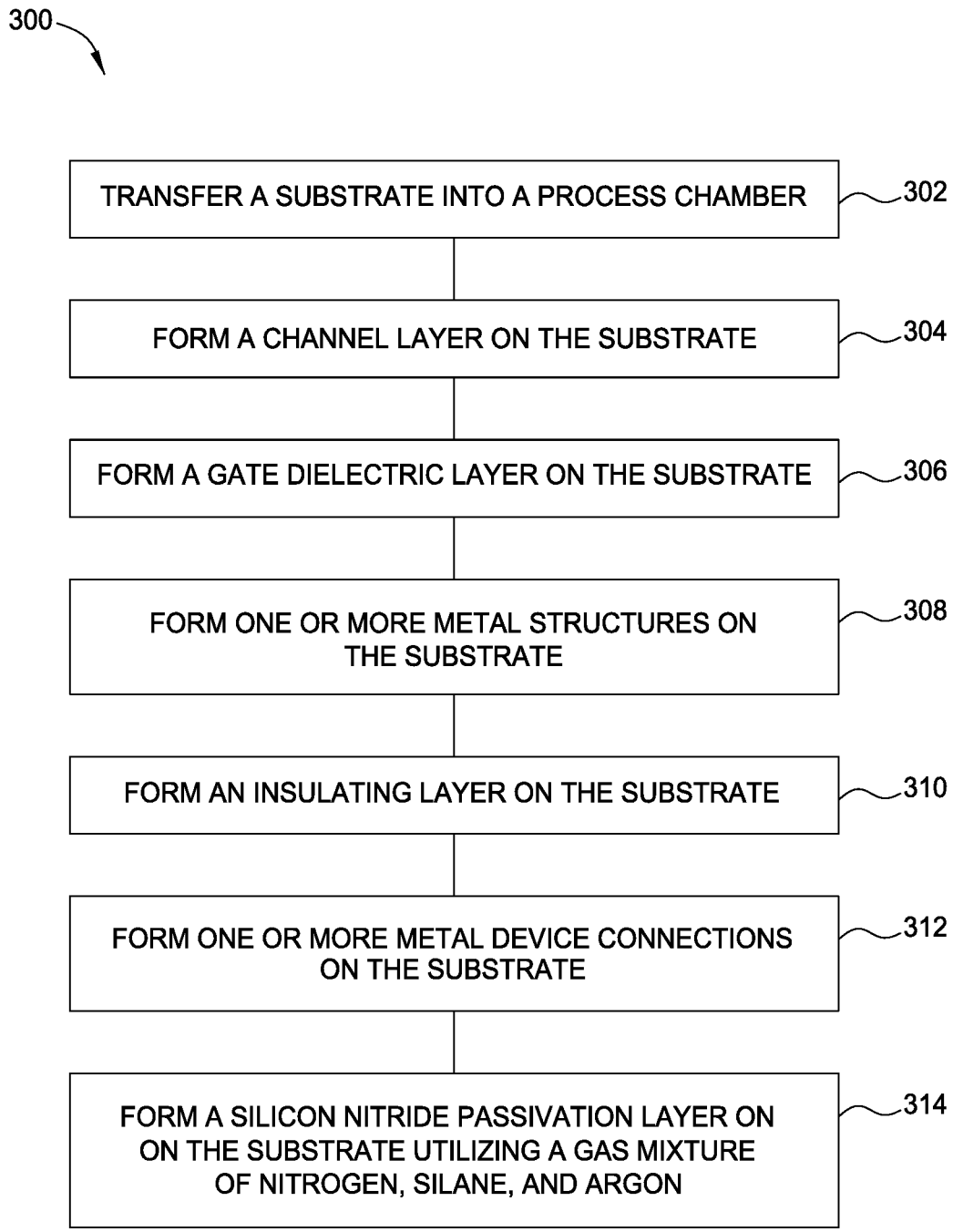
FIG. 3 illustrates a process flow diagram of a method of fabrication of a semiconductor device with a passivation layer according to one embodiment described herein.

FIG. 3 depicts a flow diagram of a fabrication method 300 of a semiconductor device having a silicon nitride passivation layer, according to one embodiment described herein. The method 300 may be practiced in the chamber 100, as described in FIG. 1, or other suitable processing chambers. The method 300 illustrates a process of depositing a passivation layer or other suitable silicon nitride containing layer that may be used in semiconductor devices, such as TFT devices. In one embodiment, the silicon nitride passivation layer may be used, alone or in combination with, any other suitable films to improve electrical properties and performance in TFT or other semiconductor devices. FIGS. 4A-4F depict an embodiment of a TFT device structure 400 having a passivation layer shown in stages of fabrication according to one embodiment described herein.

The method 300 begins at operation 302 by transferring the substrate 112, as shown in FIG. 4A, into a process chamber, such as the chamber 100 depicted in FIG. 1. In one embodiment, the substrate 412 may be one of a glass substrate, plastic substrate, polymer substrate, metal substrate, singled substrate, roll-to-roll substrate, or other suitable transparent substrate for forming a TFT device structure thereon.

At operation 304, a channel layer 414 is formed on the substrate 412. The channel layer 414 may be formed directly on the substrate 412, or may be formed on a barrier layer 404. In one embodiment, the channel layer 414 is a silicon containing channel layer, such as a polycrystalline silicon channel layer of a TFT device. For example, the channel layer 414 is formed by depositing an amorphous silicon channel layer on the substrate 412 and annealing the amorphous silicon channel layer into a polycrystalline silicon channel layer. In another embodiment, the channel layer 414 is a metal oxide channel layer, such as a metal oxide channel layer of a metal oxide type TFT device.

At operation 306, a gate dielectric layer 406 is formed on the substrate 412 and over the channel layer 414. The gate dielectric layer 406 is formed of silicon dioxide ($SiO_2$), lanthanum oxide ($La_2O_3$), hafnium dioxide ($HfO_2$), zirconium dioxide ($ZrO_2$), or other suitable high-K dielectric material. For example, the gate dielectric layer 406 is formed of a material having a dielectric constant of at least about 4 and greater, such as about 25.

At operation 308, one or more metal structures 408 are formed on the substrate 412. For example, a gate electrode layer 408 is patterned on the gate dielectric layer 406. In one embodiment, the gate electrode layer 408 is formed from any suitable metallic materials, such as indium tin oxide ($In_2O_5Sn$), indium zinc oxide (InZnO), aluminum (Al), tungsten (W), chromium (Cr), tantalum (Ta), molybdenum (Mo), copper (Cu), titanium (Ti), or alloys or combinations thereof.

At operation 310, an insulating layer 410 is formed on the substrate 412. For example, the insulating layer 410 is patterned over the metal structures 408 and the gate dielectric layer 406. The insulating layer 410 may include an interlayer dielectric formed of $SiO_2$, silicon oxynitride ($Si_2N_2O$), hafnium silicate ($HfO_4Si$), zirconium silicate ($ZrSiO_4$), or other suitable low-K dielectric materials. For example, the insulating layer 410 may be formed of a material having a dielectric constant of about 4 or less, such as about 3. The insulating layer 410 may be formed of a single layer, a composite layer, dual layers, multiple layers, or other combinations thereof as needed.

At operation 312, one or more metal device connections 422a, 422b are formed on the substrate 412. For example, the metal device connections 422a, 422b are patterned on the insulating layer 410 to form source-drain device connections for the TFT device structure 400.

At operation 314, a silicon nitride (SiN) passivation layer 420 is formed on the substrate 412. Alternatively, the SiN passivation layer 420 may be formed after further fabrication operations are performed so as to complete structures of the TFT device structure 400. The SiN passivation layer 420 may be formed of a single layer, a composite layer, dual layers, multiple layers, or other combinations thereof as needed. For example, the SiN passivation layer 420 may be formed of multiple layers, one of the multiple layers being formed of a high density SiN material and another one of the multiple layers being formed of a low density SiN material. For example, a high density SiN layer may be formed as a bottommost layer in the SiN passivation layer 420 and a low density SiN layer may be formed as a topmost layer in the SiN passivation layer 420.

The SiN passivation layer 420 is formed on the TFT device structure 400 via deposition of a silane ($SiH_4$), nitrogen ($N_2$), and argon (Ar) precursor gas mixture supplied to the chamber 100 via the showerhead 116. In one example, the SiN passivation layer 420 is formed by plasma enhanced chemical vapor deposition (PECVD) of silane and nitrogen gases in the presence of an argon diluent gas. During deposition, the process volume 110 of the chamber 100 is maintained at a pressure of about 1 Torr to about 1.8 Torr, such as about 1.5 Torr. The showerhead 116 may be adjusted within the chamber 100 to a showerhead-to-substrate spacing of about 600 mils to about 1500 mils, such as about 800 mils to about 1200 mils, for example, 1000 mils. Radio frequency (RF) power may be supplied to the showerhead 116 from one or more power sources (not shown) to excite the precursor gas mixture into a plasma. The RF power may be supplied at power levels within the range of about 8 kW to about 15 kW, such as about 10 kW to about 12 kW.

The deposition of the SiN passivation layer 420 is performed at temperatures of about 100° C. to about 300° C., such as about 150° C. to about 250° C., for example about 230° C. Passivation at lower processing temperatures enables the fabrication of TFT devices with channel layer materials having low thermal budgets, such as amorphous phase InGaZnO (IGZO), crystalline phase IGZO, or other suitable metal oxide channel layer materials with high mobility, without changing electrical properties of the channel layer materials.

However, nitrogen ion bombardment during deposition is reduced at lower processing temperatures, as less thermal energy is available to dissociate $N_2$ molecules being supplied into the chamber. Ion bombardment during deposition is utilized to improve the quality of the passivation layer film being formed, particularly at reduced processing temperatures, because kinetic energy resulting from the bombardment of precursor gas ions helps remove unwanted hydrogen ($H^+$) radicals adhering to the growing surface of the passivation layer film. Increased hydrogen content causes decreased film density through the reduction of SiN bond density, thus promoting migration of hydrogen impurities within TFT devices, such as migration to channel layers. The presence of impurities in such structures modifies the electrical properties of the elements, resulting in defective TFT devices or devices which have reduced efficiencies.

In order to compensate for the reduced nitrogen ion bombardment at such low processing temperatures, an argon gas diluent is added to the gas mixture at operation 314. In one embodiment, a volumetric flow rate for the argon gas diluent is between about 24,600 sccm and about 82,000 sccm, such as about 41,000 sccm and about 71,500 sccm. Nitrogen gas is delivered at a volumetric flow rate of about 98,400 to about 41,000 sccm, such as about 82,000 and about 51,500 sccm. Silane gas is delivered at a volumetric flow rate of about 3075 sccm. Thus, the mixing ratio of argon to nitrogen is about 1:4 $Ar:N_2$ or higher. For example, Argon is supplied to the gas mixture at mixing ratios of 1:2, 1:1, 1:1.4, or 1:2 $Ar:N_2$. Correspondingly, the mixing ratio of argon to silane is about 8:1 $Ar:SiH_4$ or higher. For example, Argon is supplied to the gas mixture at mixing ratios of 13:1, 20:1, 23:1, or 26:1 $Ar:SiH_4$.

It is contemplated that increasing the ratio of argon to nitrogen and silane increases the resultant density of the silicon nitride passivation layer being formed. The argon gas provides additional ions for bombardment during the formation of the silicon nitride passivation layer 420, thus providing sufficient kinetic energy to remove hydrogen radicals adhering to the growing surface of the silicon nitride passivation layer 420 film. As a result, hydrogen content of the silicon nitride passivation layer 420 is reduced, film density is increased, and overall quality of the TFT device structure 400 is improved.

Furthermore, it is also contemplated that using an argon gas diluent during silicon nitride passivation layer formation at operation 314 reduces subsequent hydrolysis of the passivation film. Post-deposition exposure of a silicon nitride layer to an ambient environment may result in oxidation of exposed surfaces of the silicon nitride layer. The addition of argon gas to the deposition process of the silicon nitride passivation layer improves plasma density with relatively low power, resulting in improved film layer density with decreased pore formation. Thus, moisture penetration of the film layer is reduced.

In conclusion, higher quality SiN passivation layers are formed by adding argon gas to low-temperature PECVD processes. The addition of argon to the processing gas mixture results in higher density passivation layer films with lower concentrations of hydrogen contaminants, thus curtailing hydrogen migration into various structures of TFT devices and improving overall device quality.

While the foregoing is directed to embodiments of the present disclosure, other and further embodiments of the disclosure may be devised without departing from the basic scope thereof, and the scope thereof is determined by the claims that follow.

What is claimed is:

1. A method for forming a silicon nitride passivation layer, comprising:
   transferring a substrate into a process chamber;
   heating the process chamber to a temperature of about 150° C. to about 300° C.;
   supplying a gas mixture having silane gas, nitrogen gas, and argon gas to the process chamber, the argon gas supplied at a mixing ratio of about 1:2 Ar:N2 or greater, wherein the argon gas is delivered at a volumetric flow rate of about 24600 sccm to about 82000 sccm; and forming a silicon nitride passivation layer on the substrate.

2. The method of claim 1, wherein the process chamber is heated to a temperature of about 230° C.

3. The method of claim 1, wherein the argon gas is supplied at a mixing ratio of about 2:1 Ar:N2.

4. The method of claim 1, wherein the argon gas is supplied at a mixing ratio of 13:1 Ar:SiH4 or greater.

5. The method of claim 4, wherein the argon gas is supplied at a mixing ratio of 26:1 Ar:SiH4.

6. The method of claim 1, wherein the nitrogen gas is delivered at a volumetric flow rate of about 98400 sccm to about 41000 sccm.

7. The method of claim 6, wherein the silane gas is delivered at a volumetric flow rate of about 3075 sccm.

8. The method of claim 1, wherein the process chamber is maintained at a pressure of about 1 Torr to about 1.8 Torr.

9. The method of claim 1, wherein the silicon nitride passivation layer is formed of two or more layers.

10. A method for forming a semiconductor device having a silicon nitride passivation layer, comprising:

transferring a substrate into a process chamber;

forming a channel layer on the substrate;

forming a gate dielectric layer on the substrate, the gate dielectric layer comprising a high-K material;

forming one or more metal structures on the substrate;

forming an insulating layer on the substrate, the insulating layer comprising a low-K material;

forming one or more metal device connections on the substrate;

forming a silicon nitride passivation layer on the substrate at a temperature of about 100° C. to about 300° C., the forming a passivation layer further comprising:

supplying a gas mixture having silane gas, nitrogen gas, and argon gas to the process chamber, the argon gas supplied at a mixing ratio of 1:2 Ar:N2 or greater, wherein the argon gas is delivered at a volumetric flow rate of about 24600 sccm to about 82000 sccm.

11. The method of claim 10, wherein the silicon nitride passivation layer is formed at a temperature of about 150° C. to about 250° C.

12. The method of claim 10, wherein the argon gas is supplied at a mixing ratio of 13:1 Ar:SiH4 or greater.

13. The method of claim 12, wherein the argon gas is supplied at a mixing ratio of 26:1 Ar:SiH4.

* * * * *